(12) United States Patent
Chung

(10) Patent No.: US 7,227,409 B2
(45) Date of Patent: Jun. 5, 2007

(54) APPARATUS FOR REMOVING DC OFFSET AND AMPLIFYING SIGNAL WITH VARIABLE GAIN SIMULTANEOUSLY

(75) Inventor: Yuan-Hung Chung, Jhudong Township, Hsinchu County (TW)

(73) Assignee: Sunplus Technology Co., Ltd., Hsinchu (TW)

(*) Notice: Subject to any disclaimer, the term of this patent is extended or adjusted under 35 U.S.C. 154(b) by 127 days.

(21) Appl. No.: 11/115,686

(22) Filed: Apr. 26, 2005

(65) Prior Publication Data
US 2006/0109050 A1 May 25, 2006

(30) Foreign Application Priority Data
Nov. 25, 2004 (TW) .............................. 93136263 A

(51) Int. Cl.
*H03F 3/45* (2006.01)
(52) U.S. Cl. ......................................... 330/69; 330/260
(58) Field of Classification Search ..................... None
See application file for complete search history.

(56) References Cited

U.S. PATENT DOCUMENTS

| 4,873,702 | A | 10/1989 | Chiu | .......................... 375/319 |
|---|---|---|---|---|
| 5,748,681 | A | 5/1998 | Comino et al. | ............. 378/319 |
| 5,793,230 | A | 8/1998 | Chu et al. | ..................... 327/77 |
| 5,798,664 | A | 8/1998 | Nagahori et al. | ........... 327/307 |
| 6,838,935 | B2* | 1/2005 | Suzuki | ........................ 330/69 |
| 7,023,271 | B1* | 4/2006 | Aram | ......................... 330/69 |

\* cited by examiner

*Primary Examiner*—Khanh Van Nguyen
(74) *Attorney, Agent, or Firm*—J.C. Patents

(57) ABSTRACT

An apparatus for removing DC offset and variable gain amplifying simultaneously is provided. A signal voltage level of the output terminal of the first amplifier module is A times that of the first input terminal of the first amplifier module. A voltage level of an output DC offset signal of the first low-pass filter circuit is B times that of the input signal of the first low-pass filter circuit. The output signal of the second amplifier module is a sum of a C1-time amplified first input signal of the second amplifier module and a C2-time amplified second input signal of the second amplifier module, which satisfy the following equation:

$$A \times B \times C1 = -C2.$$

17 Claims, 3 Drawing Sheets

APPARATUS FOR REMOVING DC OFFSET AND AMPLIFYING SIGNAL WITH VARIABLE GAIN SIMULTANEOUSLY

CROSS-REFERENCE TO RELATED APPLICATION

This application claims the priority benefit of Taiwan application serial no. 93136263, filed on Nov. 25, 2004. All disclosure of the Taiwan application is incorporated herein by reference.

BACKGROUND OF THE INVENTION

1. Field of the Invention

The present invention generally relates to an apparatus for removing DC offset, and particularly, to an apparatus for removing DC offset in a zero intermediate frequency receiver or a low intermediate frequency receiver.

2. Description of Related Art

A DC offset always occurs in a communication IC receiver configuration when operating at a zero intermediate frequency or a low intermediate frequency. Especially, it happens in a zero intermediate frequency receiver.

An amplifier with a variable gain would saturate when a phenomenon of DC offset occurs, which inhibits the amplifier from achieving its amplifying effect and thus raises a bit-error-rate of the receiver, even resulting in failure of receiving a signal by the receiver.

To improve an effect caused by DC offset in a zero intermediate frequency receiver or a low intermediate frequency receiver configurations, U.S. Pat. No. 4,873,702 discloses segregating DC offset by using an analog\digital converter (ADC) and a digital signal processor (DSP) and then converting the segregated DC offset signal to an analog signal by using a digital\analog converter (DAC), eventually, subtracting an original signal including the DC offset signal from the analog signal, thereby cancelling the DC offset signal.

A circuit for removing DC offset was disclosed in U.S. Pat. No. 5,748,681, wherein a high-pass filter composed of a capacitor with a large capacitance is utilized to remove the DC offset. However, since the two terminals of the capacitor are not connected to ground, it is required to employ a metal-insulator-metal (MIM) capacitor or a polysilicon-insulator-polysilicon (PIP) capacitor with a large capacitance, however these two capacitors occupy a large surface area of an IC substrate and thus cause a problem of an IC design.

Also, U.S. Pat. Nos. 5,793,230 and 5,798,664 disclose a technique of removing the DC offset, which is accomplished by using a low-pass filter composed of a capacitor with a large capacitance. However, since none of the terminal of the capacitor is connected to ground, it is required to employ a MIM capacitor or a PIP capacitor with a large capacitance, however, these two capacitors also occupy a large surface area of an IC substrate and thus cause a problem in the IC design.

In conclusion, although by utilizing the ADC, DSP, and DAC or MIM and PIP capacitors, the DC offset can be removed, the complex circuit design and consumption of large surface area of the substrate by the capacitors make it inconvenient to practically apply in the circuit design.

SUMMARY OF THE INVENTION

Accordingly, the present invention is directed to an apparatus for removing DC offset and amplifying signal with variable gain simultaneously.

The present invention is directed to an apparatus for removing DC offset and amplifying signal with variable gain simultaneously without occupying a large surface area of an IC substrate and thereby simplifying the circuit design.

According to an embodiment of the present invention, the above mentioned apparatus comprises a voltage following circuit, a first amplifier module, a first filter circuit and a second amplifier module.

The first amplifier module comprises a first resistance, a second resistance and a first operational amplifier, wherein one terminal of the first resistance is coupled to a positive input signal while another terminal thereof is coupled to an inverting input terminal of the first operational amplifier. Moreover, one terminal of the second resistance is coupled to a positive input signal while another terminal thereof is coupled to an output terminal of the first operational amplifier.

The first filter circuit comprises a third resistance and a first capacitor, wherein one terminal of the third resistance is coupled to the output terminal of the first operational amplifier while another terminal thereof is coupled to one terminal of the first capacitor, another terminal of which is connected to ground.

The second amplifier module comprises a fourth resistance, a fifth resistance, a sixth resistance and a second operational amplifier. One terminal of the fourth resistance is coupled to the positive input signal while another terminal thereof is coupled to an inverting input terminal of the second operational amplifier. One terminal of the fifth resistance is coupled to an output terminal of the first filter circuit while another terminal thereof and one terminal of the sixth resistance are coupled to the inverting input terminal of the second operational amplifier. Another terminal of the sixth resistance is coupled to an output terminal of the second operational amplifier.

The voltage following circuit has two input terminals, which are coupled to the positive input signal and a negative input signal, respectively, to output a reference voltage level to non-inverting input terminals of the first operational amplifier and the second operational amplifier.

Furthermore, the fourth resistance R4, the first resistance R1, the second resistance R2 and the fifth resistance R5 conform the following equation:

$$R4 = R5 \times \left(\frac{R1}{R2}\right).$$

According to another embodiment of the present invention, the apparatus comprises a first amplifier module, a first low-pass filter, and a second amplifier module.

The first amplifier module comprises a first input terminal and an output terminal. The first input terminal of the first amplifier module is coupled to a positive input signal and a signal voltage level of an output signal of the first amplifier module is A times that of an input signal of the first input terminal of the first amplifier module.

The first low-pass filter circuit comprises an input terminal and an output terminal, wherein the input terminal of the first low-pass filter is coupled to the output terminal of the first amplifier module to output DC offset contained in the received input signal and then amplify the DC offset by B times.

The second amplifier module comprises a first input terminal, a second input terminal and an output terminal. A first input terminal of the second amplifier module is coupled to an output terminal of a first filter while a second input terminal thereof is coupled to a positive input signal, wherein a signal voltage level of the output terminal of the second amplifier is a sum of a C1-time amplified first input signal of the second amplifier module and a C2-time amplified second input signal of the second amplifier module, which conform the following equation:

$$A \times B \times C1 = -C2$$

The present invention employs the low-pass filter to segregate DC offset from the normal input signal, wherein a frequency of the DC offset is lower than that of the normal input signal, and thereby achieve the purpose of removing the DC offset and amplifying signal with variable gain simultaneously. Furthermore, all capacitors used in the present invention can employ a metal-oxide-semiconductor field effect transistor (MOS FET), and therefore the consumption of the surface area of the substrate can be effectively reduced.

The objectives, other features and advantages of the invention will become more apparent and easily understood from the following detailed description of the invention when taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
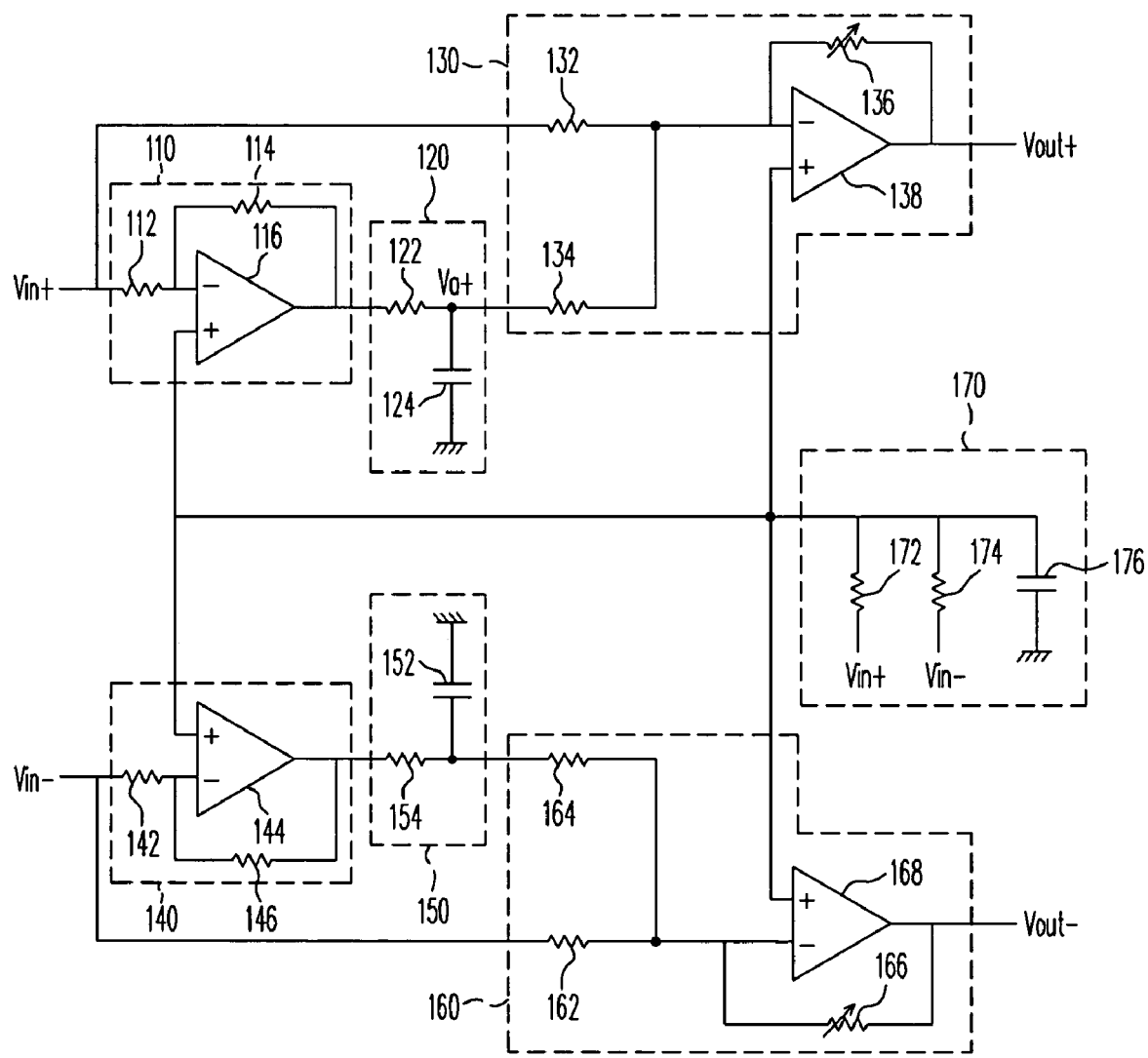
FIG. 1 shows a circuit diagram for removing DC offset and amplifying signal with variable gain simultaneously according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, a circuit diagram for removing DC offset and amplifying signal with variable gain simultaneously suitable for a zero frequency receiver in a communication receiving device according to an embodiment of the present invention is shown. Wherein a circuit 100 for removing DC offset and amplifying signal with variable gain simultaneously comprises a first amplifier module 110, a first filter circuit 120, a second amplifier module 130, a third amplifier module 140, a second filter circuit 150, a fourth amplifier module 160 and a voltage following circuit 170.

The first amplifier module 110 comprises a first resistance 112, a second resistance 114, and a first operational amplifier 116. The first filter circuit 120 comprises a third resistance 122 and a first capacitor 124 and the second amplifier module 130 comprises a fourth resistance 132, a fifth resistance 134, a sixth resistance 136 and a second operational amplifier 138.

The third amplifier module 140 comprises a ninth resistance 142, a third operational amplifier 144 and a tenth resistance 146. The second filter circuit 150 comprises an eleventh resistance 154 and a third capacitor 152. The fourth amplifier module 160 comprises a twelfth resistance 162, a thirteenth resistance 164, a fourteenth resistance 166 and the fourth operational amplifier 168. The voltage following circuit comprises a seventh resistance 172, an eighth resistance 174 and a second capacitor 176.

In the first amplifier module 110, one terminal of the first resistance 112 is coupled to a positive input signal while another terminal thereof is coupled to an inverting input terminal of the first operational amplifier 116. Furthermore, one terminal of the second resistance 114 is coupled to the inverting input terminal of the first operational amplifier 116 while another terminal thereof is coupled to the output terminal of the first operational amplifier 116.

In the first filter circuit 120, one terminal of the third resistance 122 is coupled to the output terminal of the first operational amplifier 116. A first terminal of the first capacitor 124 is coupled to another terminal of the third resistance 122 while another terminal thereof is connected to ground.

In the second amplifier module 130, one terminal of the fourth resistance 132 is coupled to the positive input signal while another terminal thereof is coupled to an inverting input terminal of the second operational amplifier 138. One terminal of the fifth resistance 134 is coupled to an output terminal of the first filter circuit 120 while another terminal thereof is coupled to the inverting input terminal of the second operational amplifier 138. Furthermore, one terminal of the sixth resistance 136 is coupled to the inverting input terminal of the second operational amplifier 138 while another terminal thereof is coupled to an output terminal of the second operational amplifier 138.

In the third amplifier module 140, one terminal of the ninth resistance 142 is coupled to a negative input signal while another terminal thereof is coupled to an inverting input terminal of the third operational amplifier 144. Furthermore, one terminal of the tenth resistance 146 is coupled to an inverting input terminal of the third operational amplifier 144 while another terminal thereof is coupled to an output terminal of the third operational amplifier 146.

In the second filter circuit 150, one terminal of the eleventh resistance 154 is coupled to an output terminal of the third operational amplifier 144. One terminal of the third capacitor 152 is coupled to another terminal of the eleventh resistance 154 while another terminal of the third capacitor 152 is connected to ground.

In the fourth amplifier module 160, one terminal of the twelfth resistance 162 is coupled to the positive input signal while another terminal thereof is coupled to an inverting input terminal of the fourth operational amplifier 168. One terminal of the thirteenth resistance 164 is coupled to an output terminal of the second filter circuit 150 while another terminal thereof is coupled to the inverting input terminal of the fourth operational amplifier 168. More, one terminal of the fourteenth resistance 166 is coupled to the inverting input terminal of the fourth operational amplifier 168 while another terminal thereof is coupled to an output terminal of the fourth operational amplifier 168.

In the voltage following circuit 170, one terminals of the seventh resistance 172, the eighth resistance 174 and the second capacitor 176 are coupled to the non-inverting input terminals of the first operational amplifier 116, the second operational amplifier 138, the third operational amplifier 144 and the fourth operational amplifier 168. Another terminal of the seventh resistance 172 is coupled to the positive input signal while another terminal of the eighth resistance 174 is coupled to the negative input signal. Further, another terminal of the second capacitor 176 is connected to ground.

According to the present embodiment, the voltage following circuit 170 receives the positive input signal and the negative input signal, respectively. In a practical application, the seventh resistance 172 and the eighth resistance 174 are designed to have the same value, thus providing a reference voltage with a zero voltage to the positive input terminals of the first operational amplifier 116, the second operational amplifier 138, the third operational amplifier 144 and the fourth operational amplifier 168. In the present embodiment, the voltage following circuit 170 can be replaced by a reference voltage and capacitors employed in the circuit may be comprised of MOS FET.

In the present embodiment, the positive input signal inputted from the input terminal comprises a positive DC offset ($V_{dc\text{-}offset}$) and a normal signal ($V_{signal}$). The positive input signal can be expressed by equation (1)

$$V_{in+} = V_{dc\text{-}offset} + V_{signal} \qquad \text{equation (1)}$$

When the first resistance 112 is R1, the second resistance is R2, the third resistance is R3 and the first capacitor is C1, the first amplifier module 116 receives the positive input signal and then amplifies it ($R_2/R_1$) times because an input of the positive input terminal of the first amplifier module 116 is a reference voltage with a zero voltage. Therefore, an output signal of the first amplifier module 116 can be represented by the equation (2):

$$V_{out} = \left(\frac{R_2}{R_1}\right) \times V_{in+} \qquad \text{equation (2)}$$

and the amplified positive input signal can be outputted to the first filter circuit 120.

Accordingly, when the ($R_2/R_1$) times amplified positive input signal outputs to the first filter circuit 120, an output signal $V_a$ of the first filter circuit 120 can be represented by the following equation:

$$V_a = \left(\frac{-R_2}{R_1}\right) \times (V_{dc\_offset}) \times \left(\frac{1}{1+s \times R_3 \times C_1}\right) + \left(\frac{-R_2}{R_1}\right) \times (V_{signal}) \times \left(\frac{1}{1+s \times R_3 \times C_1}\right)$$

Since the positive input signal comprises the positive DC offset signal and a normal signal and the frequency of the positive DC offset signal is lower than that of the normal signal, the normal signal with higher frequency can be filtered, while only allowing the DC offset signal to pass there-through, by appropriately choosing a value of the third resistance 122 and a value of the first capacitor 124. Therefore, the output signal $V_a$ of the first filter circuit 120 can be modified to an equation (3):

$$V_a = \left(\frac{R_2}{R_1}\right) \times V_{dc\text{-}offset} \qquad \text{equation (3)}$$

and output the modified output signal $V_a$ to the negative input terminal of output signal $V_a$ of the second operational amplifier 138.

When the fourth resistance 130 is R4, the fifth resistance 134 is R5 and the sixth resistance is R6, the negative input terminal of the second operational amplifier 138 receives the positive DC offset signal outputted from the first filter circuit 120. Since the input of the input terminal of the second operational amplifier 138 is a reference voltage with a zero voltage, an output signal of the second operational amplifier 138 can be modified to an equation (4):

$$\left(\frac{-R_6}{R_5}\right) \times \left(\frac{-R_2}{R_1}\right) \times (V_{dc\_offset}) \qquad \text{equation (4)}$$

While another input signal received by an inverse input terminal of second operational amplifier 138 is positive input signal. Hence, another signal of the output terminal of the second operational amplifier 138 can be represented by equation (5):

$$\left(\frac{-R_6}{R_4}\right) \times (V_{dc\_offset} + V_{signal}) \qquad \text{equation (5)}$$

Therefore, the signal at the output terminal of the second operational amplifier 138 is a sum of equation (4) and equation (5), which can be represented by equation (6):

$$V_{out+} = \qquad \text{equation (6)}$$
$$\left(\frac{-R_6}{R_4}\right) \times (V_{dc\_offset} + V_{signal}) + \left(\frac{-R_6}{R_5}\right) \times \left(\frac{-R_2}{R_1}\right) \times (V_{dc\_offset})$$

From the equation (6) of the second operational amplifier 138, it can be found that the DC offset signal can be cancelled and the normal signal is amplified ($R_6/R_5$) by choosing appropriate values of resistances to satisfy $$R_4 = R_5 \times \left(\frac{R_1}{R_2}\right).$$

Accordingly, the signal at the output terminal of the second operational amplifier 138 can be modified and can be expressed by equation (7):

$$V_{out+} = \left(\frac{-R_6}{R_4}\right) \times (V_{signal}) \qquad \text{equation (7)}$$

By appropriately adjusting a value of ($R_6/R_4$), a gain of the normal signal can be increased or reduced to achieve purpose of removing DC offset and amplifying signal with variable gain simultaneously. Furthermore, capacitors employed in the embodiment may be comprised of MOS FETs so that the occupation of the surface area of the substrate can be significantly reduced.

Figure 3:
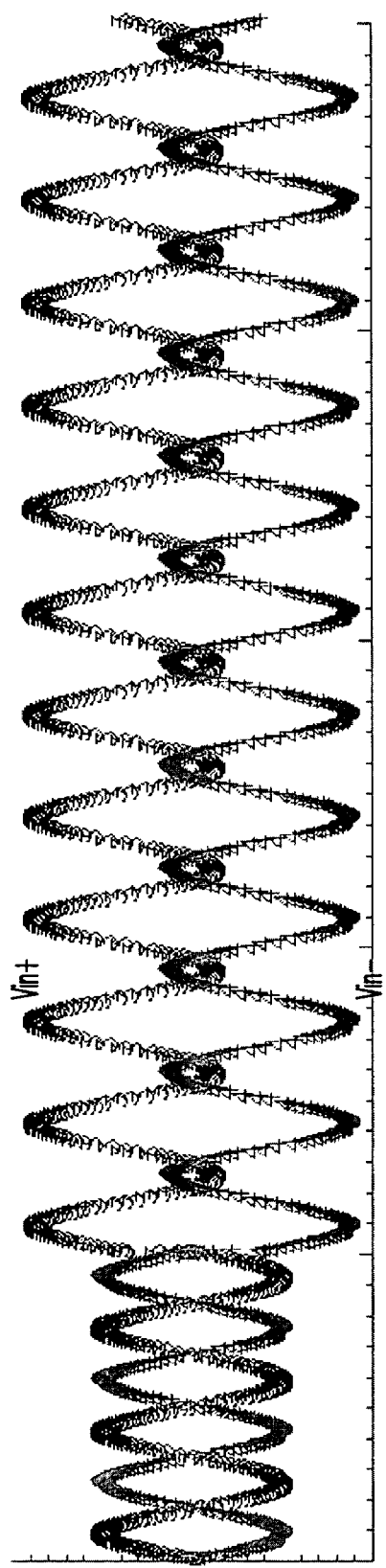
FIG. 3 is an input signal wave diagram of an apparatus for removing DC offset and amplifying signal with variable gain simultaneously according to an embodiment of the present invention.

Referring to FIG. 3, an input signal wave diagram of an apparatus for removing DC offset and amplifying signal with variable gain simultaneously according to an embodiment of the present invention is shown. As shown in FIG. 3, the input signal comprises a DC offset signal and a normal signal.

Figure 4:
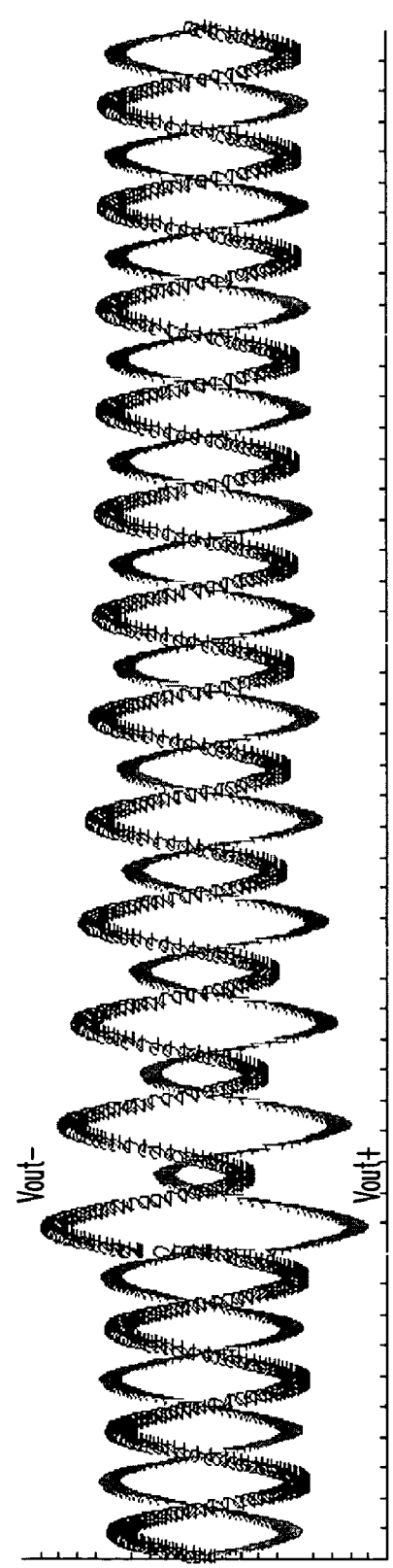
FIG. 4 is an output signal wave diagram of an apparatus removing DC offset and amplifying signal with variable gain simultaneously according to another embodiment of the present invention.

Referring to FIG. 4, an output signal wave diagram of an apparatus for removing DC offset and amplifying signal with variable gain simultaneously according to another preferred embodiment of the present invention is shown. As shown in FIG. 4, the DC offset signal contained in the input signal is obviously cancelled after it passes through the apparatus of the present invention.

Operating principles of the third amplifier module 140, the second filter circuit 150 and the fourth amplifier module 160 are similar to those of the first amplifier module 110, the first filter circuit 120 and the second amplifier module 130 described above, and therefore, the detail description of the operating principles of the third amplifier module 140, the second filter circuit 150 and the fourth amplifier module 160 are not repeated. By appropriately designing a resistance value of the eleventh resistance 154 and a capacitance value of the third capacitor 152, the normal signal can be filtered, while only allowing the negative DC offset signal to pass through.

When the ninth resistance is R9, the tenth resistance is R10, the twelfth resistance is R12, the thirteenth resistance is R13 satisfy the equation:

$$R_{12} = R_{13} \times \left(\frac{R_9}{R_{10}}\right),$$

a function for removing DC offset and amplifying signal with variable gain simultaneously can be obtained.

Figure 2:
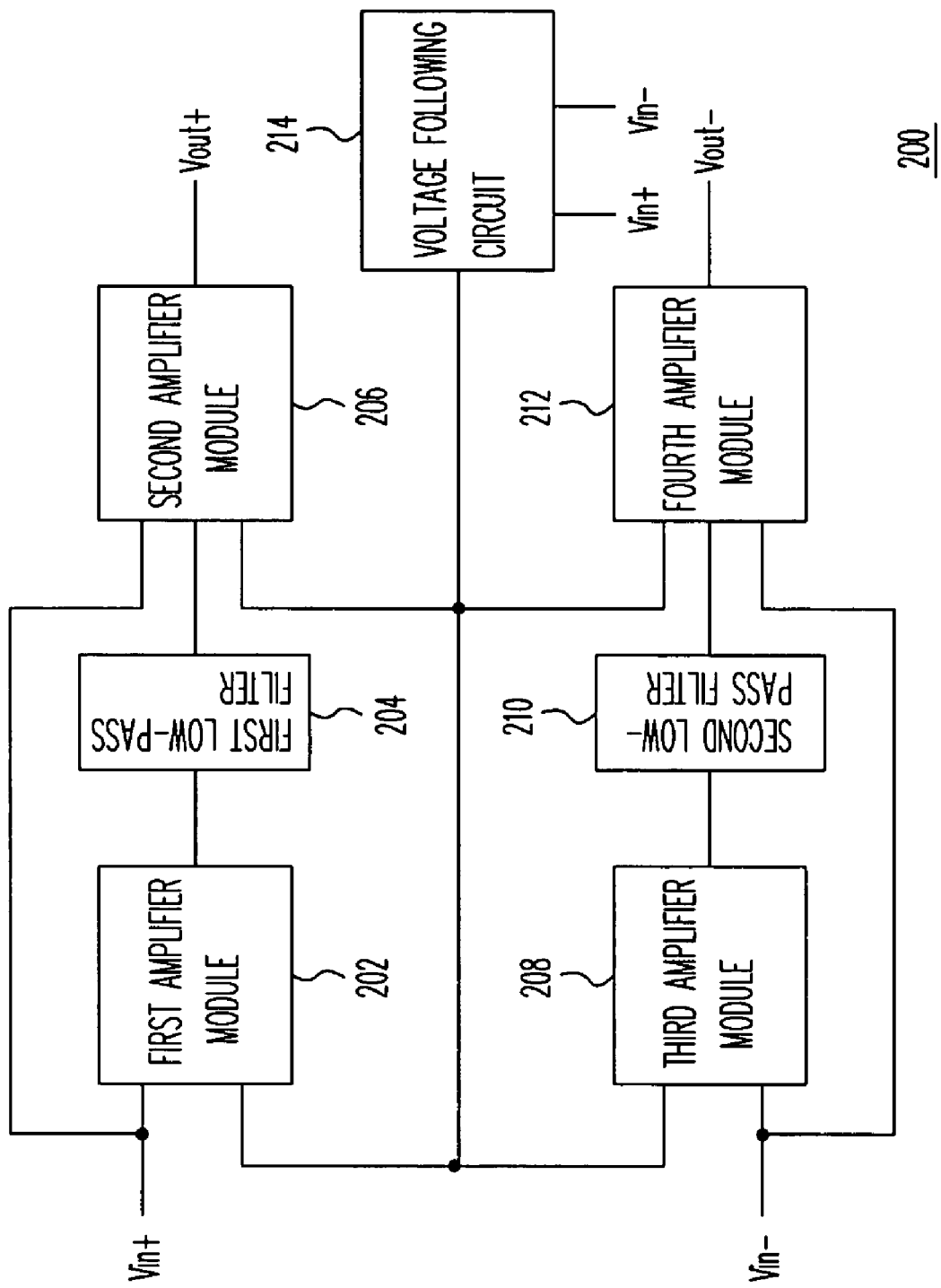
FIG. 2 shows a circuit diagram for removing DC offset and amplifying signal with variable gain simultaneously according to another preferred embodiment of the present invention.

Referring to FIG. 2, a circuit diagram for removing DC offset and amplifying signal with variable gain simultaneously suitable for a zero intermediate frequency receiver in a communication receiving device according to another embodiment of the present invention is shown. A circuit 200, for removing DC offset and amplifying signal with variable gain simultaneously, comprises a first amplifier module 202, a first low-pass filter 204, a second amplifier module 206, a third amplifier module 208, a second low-pass filter 210, a fourth amplifier module 212 and a voltage following circuit 214.

The first amplifier module 202 has a first input terminal, a second terminal and an output terminal. The input terminal of the first amplifier module 202 is coupled to the positive input signal while the second terminal thereof is coupled to the voltage following circuit 214.

The first low-pass filter 204 has an input terminal and an output terminal. The input terminal of the first low-pass filter 204 is coupled to the input terminal of the first amplifier module 202 while the output terminal thereof is coupled to the second amplifier module 206.

The second amplifier module 206 has a first input terminal, a second input terminal, a third input terminal and an output terminal. The first input terminal of the second amplifier module 206 is coupled to the positive input signal while the second terminal thereof is coupled to the output terminal of the first low-pass filter 204 and the third terminal thereof is coupled to the voltage following circuit 214.

The third amplifier module 208 has a first input terminal, a second input terminal and an output terminal. The first input terminal of the third amplifier module 208 is coupled to the negative input signal while the second input terminal thereof is coupled to the voltage following circuit 214.

The second low-pass filter 210 has an input terminal and an output terminal. The input terminal of the second low-pass filter 210 is coupled to the output terminal of the third amplifier module 208 while the output terminal thereof is coupled to the fourth amplifier module 212.

The fourth amplifier module 212 has a first input terminal, a second input terminal, a third input terminal and an output terminal. The first input terminal of the fourth amplifier module 212 is coupled to the negative input signal while the second terminal thereof is coupled to the output terminal of the second low-pass filter 210 and the third terminal thereof is coupled to the voltage following circuit 214.

The voltage following circuit 214 has a first input terminal, a second input terminal and an output terminal. The first input terminal of the voltage following circuit 214 is coupled to the positive input signal while the second input terminal thereof is coupled to the negative input signal. The voltage following circuit 214 outputs a reference voltage with a zero voltage in accordance with the magnitudes of the first input signal and the second input signal.

In the present embodiment, since a voltage gain of the first amplifier module 202 is A and its first terminal is coupled to the positive input signal, the positive input signal is amplified A times and outputted to the input terminal of the first low-pass filter 204. Furthermore, the second terminal of the first amplifier module 202 receives the reference voltage with a zero voltage.

Since the positive input signal comprises the DC offset signal and the normal signal and the frequency of the DC offset signal is lower than that of the normal signal, when the A-time amplified positive input signal is inputted to the input terminal of the first low-pass filter 204, the A-time amplified normal signal with a higher frequency will be filtered while the A-time amplified DC offset signal will be further amplified by B times and then outputted to the second terminal of the second amplifier module 206.

The first terminal of the second amplifier module 206 receives the positive input signal, which is first amplified by C times and then outputted to the output terminal. The second terminal of the second amplifier module 206 receives the A×B-time amplified positive DC offset signal outputted from the first low-pass filter 204, wherein the A×B-time amplified positive DC offset signal is amplified by C1 times and then outputted to the output terminal. The third terminal of the second amplifier module 206 receives the reference voltage with a zero voltage.

Accordingly, the output terminal of the second amplifier module 206 is a sum of the first input terminal and the second input terminal, which conform the following equation:

$$A \times B \times C1 = -C2 \qquad \text{equation (8)}$$

Thus, canceling the DC offset signal and increasing or decreasing a gain of the normal signal.

Since an amplification of the third amplifier module 208 is also A, the negative input signal with a negative DC offset signal is also amplified by A times and then outputted to the second low-pass filter 210. The second low-pass filter 210 will also filter the A-time amplified negative normal signal with a higher frequency and amplifies the A-time amplified negative DC offset signal by C1 times, which is then outputted to the second terminal of the fourth amplifier module 212.

The first input terminal of the fourth amplifier module 212 receives the negative input signal and then amplifies it by C1 times, eventually, outputting it to the output terminal. The second input terminal of the fourth amplifier module 212 receives the A×B-time amplified negative DC offset signal outputted from the second low-pass filter 210.

Accordingly, the output terminal signal of the fourth amplifier module 212 is a sum of the input signal at its first input terminal and the input signal at its second input terminal, which further conform the equation (8), thereby canceling the negative DC offset signal and increasing or reducing a gain of the negative normal signal. Thus, detail description of the operating principles of the third amplifier module 208 and the fourth amplifier module 212 are not repeated again.

In conclusion, The present invention employs the low-pass filter to segregate DC offset from the normal input signal provided a frequency of the DC offset is lower than that of the normal input signal, thereby achieving a purpose of removing the DC offset and amplifying signal with variable gain simultaneously. Furthermore, all capacitors used in the present invention can employ metal-oxide-semiconductor field effect transistors (MOS FET), and therefore, the consumption of the surface area of the substrate can be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for removing DC offset and amplifying signal with variable gain simultaneously, comprising:
   a voltage following circuit for providing a reference voltage level;
   a first amplifier module, comprising:
   a first resistance, comprising one terminal coupled to a positive input signal;
   a first operational amplifier, comprising an inverting terminal coupled to another terminal of the first resistance; and
   a second resistance, comprising one terminal coupled to the inverting terminal of the first operational amplifier, and another terminal coupled to an output terminal of the first operational amplifier;
   a first filter circuit, comprising:
   a third resistance, comprising one terminal coupled to the output terminal of the first operational amplifier;
   a first capacitor, comprising one terminal coupled to one terminal of a fourth resistance, and another terminal connected to ground;
   a second amplifier module, comprising:
   a fourth resistance, comprising one terminal coupled to the positive input signal;
   a fifth resistance, comprising one terminal coupled to an output terminal of the first filter circuit;
   a second operational amplifier, comprising a non-inverting input terminal coupled to the voltage following circuit and an inverting input terminal coupled to another terminals of the fourth resistance and the fifth resistance; and
   a sixth resistance, comprising one terminal coupled to the inverting terminal of the second operational amplifier, and another terminal coupled to an output terminal of the second operational amplifier;
   wherein the fourth resistance is R4, the first resistance is R1, the second resistance is R2 and the fifth resistance is R5, and wherein $$R_4 = R_5 \times \frac{R_1}{R_2}.$$

2. The apparatus according to claim 1, wherein the voltage following circuit comprises:
   a seventh resistance, comprising one terminal coupled to the non-inverting input terminals of the first operational amplifier and the second operational amplifier, and another terminal coupled to the positive input signal;
   a eighth resistance, comprising one terminal coupled to the non-inverting input terminals of the first operational amplifier and the second operational amplifier, and another terminal coupled to a negative input signal; and
   a second capacitor, comprising one terminal coupled to the non-inverting input terminals of the first operational amplifier and the second operational amplifier, and another terminal connected to ground;
   wherein the seventh resistance is R7 and the eighth resistance is R8, and wherein R7=R8.

3. The apparatus according to claim 1, wherein the apparatus is suitable for a communication receiving device.

4. The apparatus according to claim 3, wherein the communication receiving device is a zero intermediate frequency receiver.

5. The apparatus according to claim 1, wherein the voltage following circuit is a reference voltage provider.

6. The apparatus according to claim 1, wherein the sixth resistance is a variable resistance.

7. The apparatus according to claim 1, wherein the first capacitor is a variable capacitor.

8. The apparatus according to claim 1, wherein the first capacitor comprises a metal-oxide-semiconductor field effect transistor.

9. The apparatus according to claim 1, further comprising:
   a third amplifier module, comprising:
   a ninth resistance, comprising one terminal coupled to the negative input signal;
   a third operational amplifier, comprising an inverting input terminal coupled to another terminal of the ninth resistance, and a non-inverting terminal coupled to the voltage following circuit; and
   a tenth resistance, comprising one terminal coupled to the inverting input terminal of the third operational amplifier, and another terminal coupled to an output terminal of the third operational amplifier;
   a second filter circuit, comprising:
   an eleventh resistance, comprising one terminal coupled to the output terminal of the third operational amplifier; and
   a third capacitor, comprising one terminal coupled to another terminal of the eleventh resistance, and another terminal connected to ground;

a fourth amplifier module, comprising:
a twelfth resistance, comprising one terminal coupled to the negative input signal;
a thirteenth resistance, comprising one terminal coupled to the output terminal of the second filter circuit;
a fifth operational amplifier, comprising a non-inverting input terminal coupled to the voltage following circuit, and an inverting input terminal coupled to another terminals of the twelfth resistance and the thirteenth resistance; and
a fourteenth resistance, comprising one terminal coupled to the inverting input terminal of the fourth operational amplifier, and another terminal coupled to an output terminal of the fourth operational amplifier;
wherein the twelfth resistance is R12, the ninth resistance is R9, the tenth resistance is R10 and the thirteenth resistance is R13, and wherein $$R_{12} = R_{13} \times \left(\frac{R_9}{R_{10}}\right).$$

10. The apparatus according to claim 7, wherein the fourteenth resistance is a variable resistance.

11. The apparatus according to claim 7, wherein the third capacitor is a variable capacitor.

12. The apparatus according to claim 7, wherein the third capacitor comprises a metal-oxide-semiconductor field effect transistor.

13. An apparatus for removing DC offset and amplifying signal with variable gain simultaneously, comprising:
a first amplifier module, comprising a first input terminal and an output terminal, wherein the first input terminal of the first amplifier module is coupled to a positive input signal comprised of a positive DC offset signal and a normal signal, and a voltage level of an output signal from the output terminal of the first amplifier module is A times that of the first input terminal of the first amplifier module;
a first low-pass filter circuit, comprising an input terminal and an output terminal, wherein the input terminal of the first low-pass filter circuit is coupled to the output terminal of the first amplifier module, which in turn outputs B-time amplified positive DC offset signal and filters the B-time amplified normal signal;
a second amplifier module, comprising a first input terminal, a second input terminal and an output terminal, wherein the first input terminal of the second amplifier module is coupled to the output terminal of the first low-pass filter circuit and the second input terminal of the second amplifier module is coupled to the positive input signal, a second output signal of the second amplifier module being a sum of an amplified C1-time first input signal of the second amplifier module and an amplified C2-time second input signal of the second amplifier module, wherein A, B, C1, C2 are non-zero real numbers and wherein A×B×C1=−C2.

14. The apparatus according to claim 13, further comprising:
a third amplifier module, comprising a first input terminal and an output terminal, wherein the first input terminal of the third amplifier module is coupled to a negative input signal comprised of a negative DC offset signal and the normal signal, a voltage level of a third output signal of the third amplifier module being A times that of the first input terminal of the third amplifier module;
a second low-pass filter circuit, comprising an input terminal and an output terminal, wherein the input terminal of the second low-pass filter circuit is coupled to the output terminal of the third amplifier module, which in turn outputs the B-time amplified negative DC offset signal and filters the B-time amplified normal signal; and
a fourth amplifier module, comprising a first input terminal, a second terminal and an output terminal, wherein the first input terminal of the fourth amplifier module is coupled to the output terminal of the second low-pass filter circuit and the second input terminal of the fourth amplifier module is coupled to the negative input signal, a fourth output signal of the fourth amplifier module being a sum of an amplified C1-time first input signal of the fourth amplifier module and an amplified C2-time second input signal of the fourth amplifier module.

15. The apparatus according to claim 14, further comprises a voltage following circuit coupled to the positive input signal and the negative input signal to output a reference voltage, wherein the first amplifier module further comprises a second input terminal, the second amplifier module further comprises a third input terminal, the third amplifier module further comprises a second input terminal and the fourth amplifier module further comprises a third input terminal, all input terminals being connected to ground.

16. The apparatus according to claim 13, wherein the apparatus is suitable for a communication receiving device.

17. The apparatus according to claim 16, wherein the communication receiving device is a zero intermediate frequency receiver.

* * * * *